United States Patent [19]
Nakato

[11] Patent Number: 5,395,771
[45] Date of Patent: Mar. 7, 1995

[54] GRADED IMPLANTATION OF OXYGEN AND/OR NITROGEN CONSTITUENTS TO DEFINE BURIED ISOLATION REGION IN SEMICONDUCTOR DEVICES

[75] Inventor: Tatsuo Nakato, Vancouver, Wash.

[73] Assignees: Sharp Kabushiki Kaisha, Osaka, Japan; Sharp Microelectronics Technology, Inc., Camas, Wash.

[21] Appl. No.: 232,880

[22] Filed: Apr. 25, 1994

Related U.S. Application Data

[63] Continuation of Ser. No. 861,141, Mar. 31, 1992, abandoned.

[51] Int. Cl.⁶ .......................................... H01L 21/265
[52] U.S. Cl. ....................................... 437/24; 437/26; 437/27
[58] Field of Search ........................ 437/24, 26, 27, 62

[56] References Cited

U.S. PATENT DOCUMENTS

| | | |
|---|---|---|
| 4,948,742 | 8/1990 | Nishimura et al. |
| 4,975,126 | 12/1990 | Margail et al. |
| 5,143,858 | 9/1992 | Tomozane et al. |
| 5,196,355 | 3/1993 | Wittkower ............... 437/24 |

FOREIGN PATENT DOCUMENTS

| | | |
|---|---|---|
| 57-211749 | 12/1982 | Japan. |
| 58-60556 | 4/1983 | Japan. |

OTHER PUBLICATIONS

K. J. Reeson, Electronics Letters, vol. 22, #9, Apr. 1986 "Formation of Multilayer $Si_3N_4$ Str. R by Nitrogen Ion Impl."

A. E. White et al., Appl. Phys. Lett., 50(1), 5 Jan. 1987, 320 "Mechanisms of buried oxide formation by ion implantation".

D. Hill et al., J. Appl. Phys., 63(10) 15 May 1988, 4933 "The reduction of dislocations in O implanted SOI by seq. ion impl."

S. N. Bunker et al., Mat. Res. Soc. Symp. Proc., vol. 93 p. 125 "Formation of SOI Structures by multiple oxygen implantations".

Nakashima et al., *Buried oxide layers formed by low-dose oxygen implantation*, J. Mater. Res., vol. 7, No. 4, Apr. 1992, pp. 788–790.

Nakashima et al., *SIMOX wafers with low dislocation density produced by a 100–mA–class high–current oxygen implanter*, Nuclear Instruments and Methods in Physics Research B55 (1991) pp. 847–851.

*Primary Examiner*—Brian E. Hearn
*Assistant Examiner*—Leon Radomsky
*Attorney, Agent, or Firm*—Fliesler, Dubb, Meyer & Lovejoy

[57] ABSTRACT

A graduated concentration profile is used defining a buried isolation region in a semiconductor device. Smaller concentrations of dielectric-defining particles are used for implantation at the deepest levels of the isolation region in order to reduce the defect density in an overlying epi layer.

28 Claims, 3 Drawing Sheets

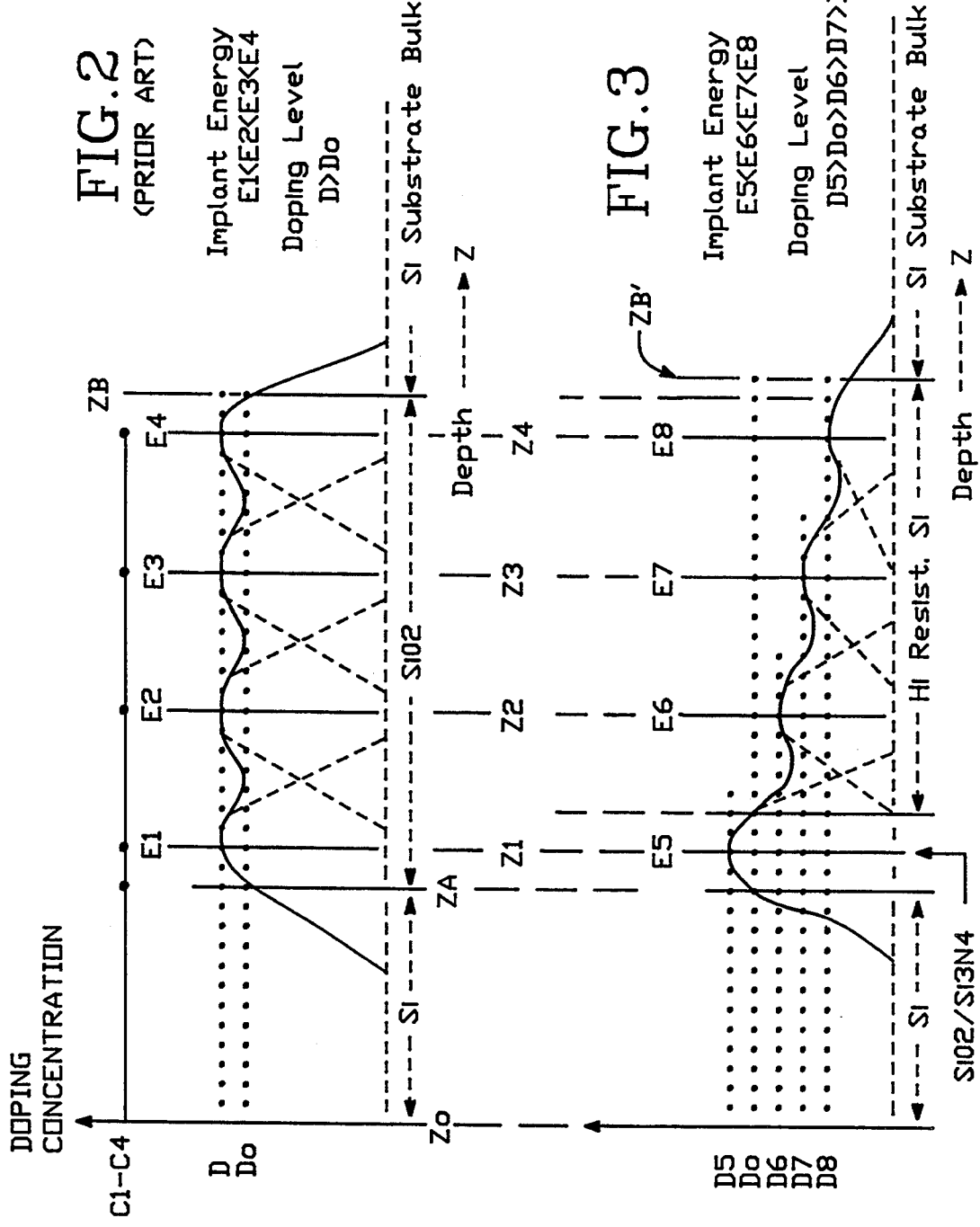

GRADED IMPLANTATION OF OXYGEN AND/OR NITROGEN CONSTITUENTS TO DEFINE BURIED ISOLATION REGION IN SEMICONDUCTOR DEVICES

This application is a continuation of Ser. No. 07/861,141, filed Mar. 31, 1992, now abandoned.

BACKGROUND OF THE INVENTION

1. Field of the Invention

The invention is generally directed to semiconductor fabrication. The invention is more specifically directed to the formation of a buried isolation region using implantation of oxygen, nitrogen or other insulation-forming particles into a single crystal semiconductor substrate.

2. Description of the Related Art

It is sometimes desirable, in the fabrication of integrated circuit (IC) devices, to define an insulator region buried deep within a semiconductor substrate. The insulator region provides electrical isolation between a top portion of the substrate (epi region) and a deeper portion of the substrate (bulk region).

The term "electrical isolation" is used here to mean that one or more of the following conditions are met: (a) a relatively high resistance separates the epi region electrically from the bulk region; (b) a relatively small capacitance separates the epi region electrically from the bulk region; and (c) the electrical separation of the epi region from the bulk region is able to withstand high voltages without breakdown. Resistance is maximized, capacitance is minimized and breakdown voltage is maximized by providing a relatively thick insulator region of homogenous high resistivity and homogenous low dielectric constant between parts of the substrate that are to be isolated from one another.

Traditional isolation techniques create a homogenous high doping concentration of insulative molecules within the substrate. In a silicon (Si) substrate for example, a concentration of approximately $2 \times 10^{18}$ atoms/cm$^2$ of oxygen is provided uniformly across a buried insulator region of one-half micron (0.5 µm) or greater thickness. High energy implantation is used to introduce oxygen atoms into a subsurface region of a semiconductor substrate. When the substrate is monocrystalline silicon, the silicon atoms combine with the implanted 0 atoms to produce $SiO_2$.

Implantation of the oxygen atoms initially produces a very thin region (e.g., 0.1 µm or less) of extremely high concentration. Post-implant heat treatment diffuses the implanted particles over a broader region (0.5 µm). The resultant concentration of insulation-forming particles then assumes a Gaussian-like (bell-shaped) distribution relative to the initial implant depth.

Practitioners conventionally implant equal concentrations of oxygen atoms at a series of equally-spaced levels below the substrate surface in order to create a thick homogenous insulator region. During post-implant heat treatment, the Gaussian diffusion distributions of the multiple implants overlap to produce a nearly homogenous concentration of insulation-forming atoms.

There is a drawback to this method, however. Each high-energy implantation disadvantageously creates defects in the crystal structure of the region through which it passes. The number of defects tends to increase as the concentration of implant atoms increases. The number of defects also tends to increase as the implant energies increase.

When buried insulator regions of homogenous composition are produced within a semiconductor device by way of high energy implantation, the deepest implant causes the most damage to the crystal structure of the overlying epi region. Progressively less but nonetheless cumulative damage is produced by the high energy implantation of atoms into progressively shallower depths.

The resultant damage to the crystal structure of the epi layer can interfere with the operability of electronic circuits that are defined in the epi region either at later or earlier times. Production yields can become unacceptably low. The cost of fabricating circuits with implant-defined insulator regions then becomes unattractively high.

A need exists in the industry for a high yield fabrication method that can provide electrical isolation by way of high energy implantation.

SUMMARY OF THE INVENTION

In accordance with the invention, plural implantations of insulation-forming and/or dielectric-forming particles are provided but the implantation concentrations are graduated such that deeper implantations are of a substantially lower concentration and shallower implantations are by comparison of a substantially higher concentration. The result is less damage to the overlying semiconductor region through which the implanted particles pass.

BRIEF DESCRIPTION OF THE DRAWINGS

The invention will be described with reference to the following drawings in which:

FIG. 2 is a plot showing conventional concentration distribution of particles used for forming the isolation region.

FIG. 3 is a plot showing a sample concentration distribution of particles used for forming a buried dielectric region in accordance with the invention.

DETAILED DESCRIPTION

Figure 1:
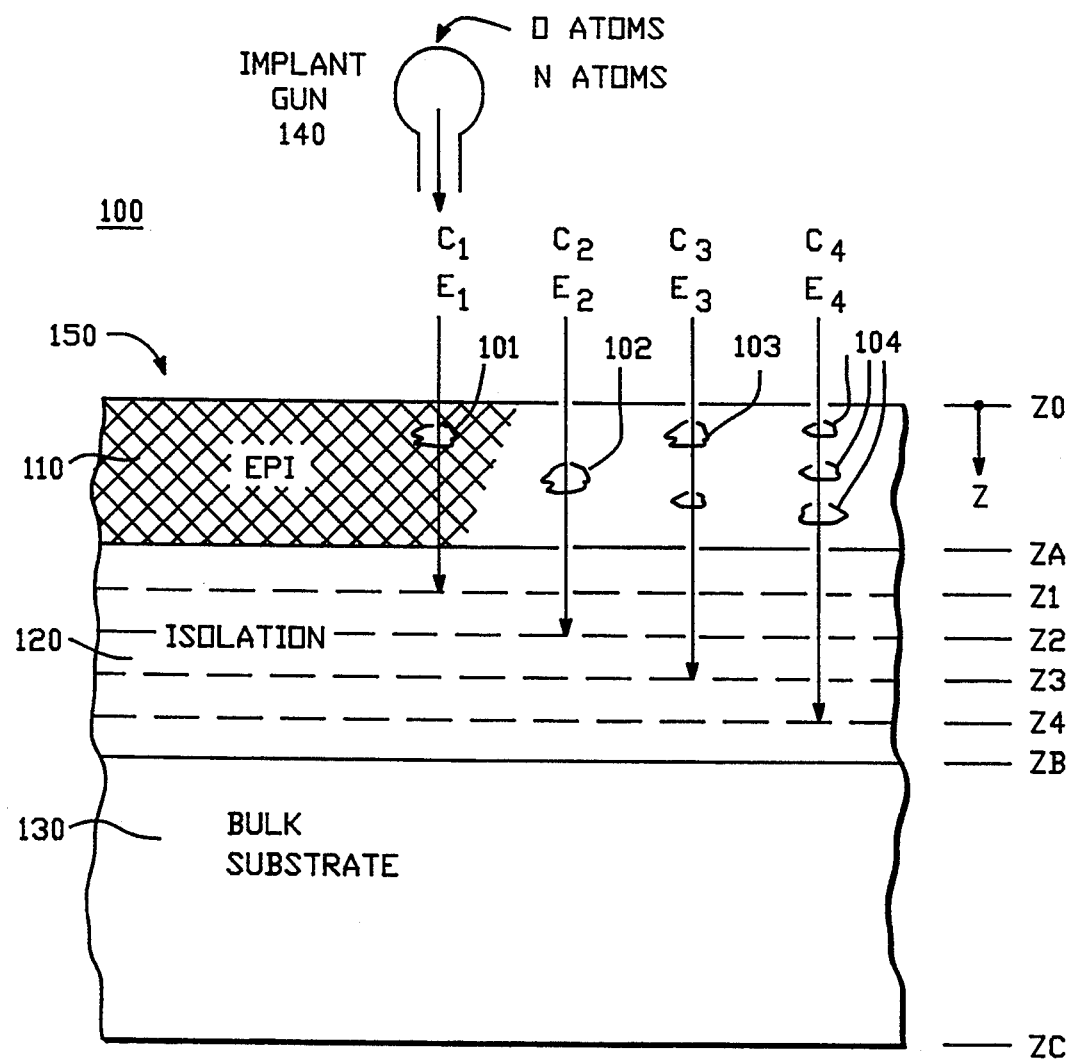
FIG. 1 is a cross-sectional view of a semiconductor substrate having an isolation region defined between an epi layer and a bulk layer.

FIG. 1 shows a fabrication environment 100 in which an ion or other particle implant gun 140 fires concentrations C1, C2, C3, C4 of oxygen and/or nitrogen atoms at respective energy levels E1, E2, E3, E4 into a semiconductor substrate 150 in order to define an isolation region 120 within the semiconductor substrate 150. Depth is measured downwardly from the top surface of substrate 150 towards a bulk portion 130 of the substrate (along the Z direction). The top surface of substrate 150 is referenced as level Z0.

Initially, substrate 150 is composed of monocrystalline silicon. The crystal structure is preferably homogenous and defect-free.

At a first time point ($t_1$), a high concentration C1 of oxygen and/or nitrogen atoms is fired using a first energy, E1, from implant gun 140 through the top surface Z0 of the substrate to a level Z1 below the substrate surface. This step is followed by high temperature annealing.

At a second time ($t_2$), another high concentration C2 of oxygen and/or nitrogen atoms is fired at higher energy level E2 (E2>E1) to a deeper level Z2 of the substrate (Z2>Z1). High temperature annealing follows. The process repeats with higher energy level E3 (E3>E2) being used to implant concentration C3 of O and/or N atoms to yet a deeper level Z3 (Z3>Z2) and another annealing step follows. Even higher energy E4 (E4>E3) is used to drive concentration C4 of dopants to yet deeper level Z4 (Z4>Z3) and yet a further annealing step follows.

The end result is the formation of a buried isolation region 120 which is composed of $SiO_2$, or $Si_3N_4$, or a mixture of these compounds, or a composition of the general form $Si_aO_bN_c$ (where $a>0$ and $a+b+c=100\%$). The isolation region extends between depths ZA and ZB where Z0<ZA<Z1<Z4<ZB<ZC. ZC is a level deep within the bulk region 130 of the substrate.

FIG. 2 is a plot of the resulting concentration (atoms/cm$^3$) of insulation-forming particles (oxygen atoms) after a conventional implant technique is used. A relatively stoichiometric concentration in the concentration of oxygen atoms in the concentration range D-D0 develops between depths ZA and ZB as a result of high temperature diffusion. Implant concentrations C1 through C4 are all the same. The post-anneal peak concentration, D, at each of the implant levels, Z1-Z4, is less than C1-C4. Overlapping diffusion gradients, centered at respective levels Z1, Z2, Z3 and Z4, produce the final generally stoichiometric distribution of $SiO_2$ molecules in region ZA-ZB. In one example, the peak concentration D, is $5 \times 10^{22}$ atoms/cm$^3$ of O atoms, the minimum concentration, $D_0$, is $4.6 \times 10^{22}$ atoms/cm$^3$ and energies E1, E2, E3, E4, are respectively, 20 KeV, 25 KeV, 30 KeV and 35 KeV. The corresponding depths are ZA=375 Å, Z1=500 Å, Z2=625 Å, Z3=750 Å, Z4=875 Å and ZB=1000 Å. The concentration of the implant atoms is sufficient to define a resistivity of at least $10^9$ ohm.cm and a relative dielectric constant less than that of Si, e.g., no more than 10 throughout region 120. In such a case isolation region 120 can be said to consist essentially of $SiO_2$ with no or relatively few Si atoms being left in region 120 that are not bound to an O atom.

Referring back to FIG. 1, the region 110 between levels Z0 and ZA is referred to as the epi layer 110. For the uniform concentration distribution condition depicted by FIG. 2, the region 120 between levels ZA and ZB is referred to as a buried isolation layer 120. The region below ZB is referred to as the bulk substrate region 130.

The cross hatching in epi layer 110 is meant to indicate that the monocrystalline structure of this layer 110 plays an important role in subsequent (or prior) fabrication steps. Conductivity-defining dopants such as arsenic and phosphorous are introduced into epi layer 110 at other fabrication steps to create transistors, diodes and other electronic components.

High energy implantation tends to produce defects in the crystal structure of epi layer 110. If enough defects (e.g., 101) develop in the epi layer 110, such defects can interfere with the proper operation of electronic components defined in epi layer 110. If the number of crystal defects is too large, such as $10^5$/cm$^2$ or more, and/or the length of the defects is too large, such as a few micrometers each or longer, the electronic circuitry (not shown) of the epi layer 110 may be rendered inoperative in some cases, and as a result, mass production yields can become relatively low. This is undesirable because the cost of fabricating operative devices then becomes quite high.

The first implantation (C1,E1) tends to produce a relatively small number and/or size of defects 101 in epi layer 110. The second, more energetic implantation (C2,E2) tends to produce more and/or larger defects 102 in the epi layer. Similarly, third implantation (C3,E3) tends to produce even more and/or larger defects 103, and fourth implantation (C4,E4) tends to produce yet more and/or larger defects 104. Post-implantation annealing heals some, but not all defects. Generally speaking, the final defect count in the epi layer may be expressed as a cumulative function of the implant energy multiplied by the implant concentration used in each implantation. This concept is expressed in the below sum of products equation, Eq.(1):

Defect count=$f_1$(C1·E1)+$f_2$(C2·E2)+$f_3$(C3·E3)+$f_4$(C4·E4)   Eq.(1)

The symbol Cn·En represents the product of concentration and energy for each implantation, n=1,2,3, ..., etc. The symbol $f_n$ represents a contribution function (e.g., a linear function) of each implant to the overall defect count. Defect count can be expressed as the number of crystal defects having a size equal to or greater than a specified minimum. The minimum size detected by wet etching is usually 0.1 μm. The highest contribution to the epi layer defect count is from the most energetic implantation, $f_4$(C4·E4), because this implantation uses the highest amount of energy for reaching the deepest level, Z4.

Referring again to FIG. 2, the advantage of providing a stoichiometric distribution of insulative material ($SiO_2$ and/or $Si_3N_4$) between levels ZA and ZB is that room temperature electrical current leakage between epi layer 110 and bulk region 130 can be made relatively small such as $10^{-10}$ ampere/cm$^2$, even under high voltage conditions. This is an order of magnitude better than the $10^{-9}$ ampere/cm$^2$ leakage obtained with conventional P/N junction isolation. Low leakage current is important in the fabrication of low power memory devices and other low power integrated circuits.

The electrical resistance of isolation region 120 may be generally expressed by the following equation Eq.(2) in the case where its composition is homogeneous.

$$R_{120} = D \cdot (ZB-ZA) \cdot K_2 \qquad \text{eq. (2)}$$

In above equation Eq.(2), ZB—ZA represents the thickness of the buried isolation region 120 and D approximates the concentration of insulator-forming particles in region 120. $K_2$ is a galvanometric conversion factor for converting between units of resistance and units of particle concentration.

Equation Eq.(2) can be rewritten in the form of the following integration:

$$R_{120} = K_2 \cdot \int_{z=ZA}^{z=ZB} (dD)dZ \qquad \text{Eq. (3)}$$

where dD is the per cm$^2$ concentration of insulator-forming particles (O and/or N) distributed at each given depth Z.

For high frequency circuit operation, the capacitive coupling between epi layer 110 and bulk region 130 is also a concern. Capacitance between epi layer 110 and bulk region 130 is a function of the dielectric constant in region 120 and the thickness of region 120. Generally speaking, it may be expressed by the following equation, Eq.(4) in the case where the composition of region 120 is homogeneous.

$$C_{120} = 1/(D \cdot ZB - ZA)) \cdot K_3 \qquad \text{Eq. (4)}$$

Above equation Eq.(3) assumes a uniform distribution D of insulator material in region 120 as indicated by FIG. 2. $K_3$ is a galvanometric conversion factor for converting between units of capacitance (e.g., farads) and units of reciprocal concentration.

Equation Eq.(4) can be rewritten as the following equation Eq.(5):

$$C_{120} = K_3 \cdot \int_{z=ZA}^{z=ZB} (dD)dZ \qquad \text{Eq. (5)}$$

Intrinsic silicon has a relatively high dielectric constant (approximately 12 relative to fee space), but addition of dielectric-defining particles such as O or N tends to reduce the dielectric constant to a value of 10 or below. The resulting capacitive coupling between region 110 and region 130 is thus reduced.

FIG. 3 is a plot of implanted particle concentration versus depth for a semiconductor device and fabrication method in accordance with the invention. As seen, the implantation concentration decreases significantly as the implantation depth increases. Implant energy E5 (e.g., 20 KeV) is used to create peak concentration D5 at depth Z1, as shown. High temperature annealing follows. In one embodiment, concentration D5 is the same as comparative concentration D of FIG. 2, namely, $5 \times 10^{22}$ atoms/cm$^3$. D5 should be at least as large as D0. D0 is defined as the concentration at which a stoichiometric insulator is formed. For a composition of SiO$_2$, concentration D0 is typically $4.6 \times 10^{22}$ atoms of oxygen per cm$^3$. For a composition of Si$_3$N$_4$, concentration D0 is typically $3.1 \times 10^{22}$ atoms of nitrogen per cm$^3$.

In another step, implant energy E6 (E6=E2) is used to create a lower peak concentration D6 of dielectric-forming particles at depth Z2 where D6 is substantially less than D0. In one embodiment, D6 is 80% or less of D5, e.g., D6=$4.0 \times 10^{22}$ atoms/cm$^3$. High temperature annealing follows. Similarly, an even smaller peak concentration=D7 of dielectric-forming particles is formed at depth Z3 by higher implant energy E7 and yet a lower concentration D8 of dielectric-forming impurities are produced at depth Z4 by yet higher implant energy E8. D7 can be 60% or less of D5 (e.g., D7=$3.0 \times 10^{22}$ atoms/cm$^3$) and D8 can be 40% or less of D5 (e.g., D8=$2.0 \times 10^{22}$ atoms/cm$^3$). Implant E8 is preferably performed first and E5 last so that implant E8 is followed by more high temperature anneals. This can reduce the total number of defects. Effective depth ZB$^1$ can extend slightly below effective depth ZB.

A key advantage of the doping structure shown in FIG. 3 is that the cumulative implant damage to the epi layer 110 is reduced. Current leakage through buried region 120 might be slightly higher under high voltage conditions because the resistance between levels ZA and ZB is smaller, but this disadvantage is offset by significantly improved yield in mass-production situations.

The composition formed between depths ZA and ZB can be generally characterized as Si$_a$O$_b$N$_c$ where composition factors, "a", "b" and "c" define the atomic sum, d=a+b+c. Factor "a" increases gradually from a level of 20% or greater towards 100% of "d" as one moves from ZA to ZB while b and c decrease. Factor c can be as large as 4/7 of atomic sum d but preferably, factor c should be kept at 50% or less of sum d and more preferably at 2% or less of sum d in region 120. Factor b can be as high as ⅔ of factor d but drops towards 0% as depth increases below level ZB.

Figure 4:
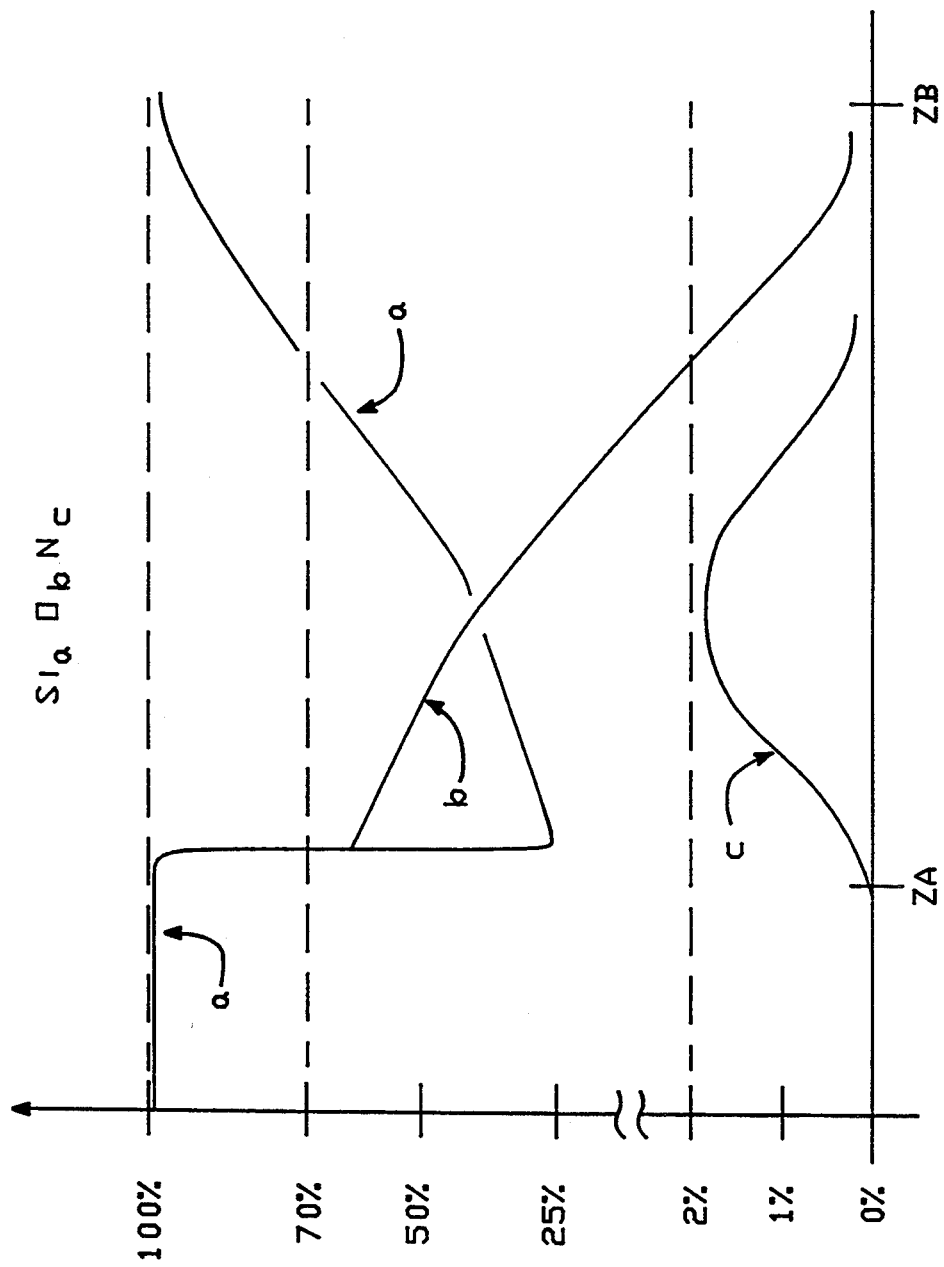
FIG. 4 is a plot showing a sample composition $Si_aO_bN_c$ of low dielectric material which is defined in the buried dielectric region.

FIG. 4 diagrams one possible distribution of factors a, b and c through region 120. Factor c peaks at or below 2% approximately midway between depths ZA and ZB. This is done to minimize dislocation stress within the crystal structure due to insertion of nitrogen atoms. Factor b decreases from approximately 66% to 0% while factor a increases from approximately 34% to 100% as one moves from depth ZA to depth ZB.

Of importance it should be observed that the dielectric constant in isolation region 120 is maintained at a level below that of intrinsic silicon. Capacitive coupling between epi region 110 and bulk region 130 is held to an acceptable low level. At the same time, the number of defects which would otherwise develop in epi region 110 is reduced in comparison to the number which would have formed if implantation sought to produce a homogenous concentration of insulator-forming particles in dielectric region 120. Alternatively, it can be said that for a given, acceptable defect density, one obtains less capacitive coupling between regions 110 and 130 by using the above-described implant profile.

Numerous variations and modifications will become apparent to those skilled in the art after reading the above disclosure. The embodiments disclosed above are meant to be illustrative rather than limiting. The substrate material could include Ge and/or GaAs in addition to or to the exclusion of Si. Dielectric-defining materials in region 120 can include GeO$_2$ or Ge$_a$N$_b$O$_c$ or insulative compounds of GaAs.

What is claimed is:

1. A method for creating a buried isolation region in a crystalline semiconductor substrate, the method comprising the steps of:

implanting a first concentration C1 of insulation-forming particles to a first depth Z1 of the substrate using first energy E1, said first implanting directly producing first defects in the crystalline structure of the substrate, the number or size of the first defects being a first function f(C1·E1) of the product of the first concentration C1 and the first energy E1;

implanting a second concentration C2 of insulation-forming particles to a second depth Z2 of the substrate using second energy E2, said second implanting directly producing second defects in the crystalline structure of the substrate, the number or size of the second defects being a second function f(C2·E2) of the product of the second concentration C2 and the second energy E2; and annealing the substrate between the first and second implant steps;

where Z2>Z1, E2>E1 and C2 is substantially less than C1 so that the number or size of said second defects produced in the substrate above first depth Z1 by the second, more energetic implant step ($E2 \cdot C2$) is not substantially more than the number or size of said first defects produced by the first implant ($E1 \cdot C1$).

2. The method of claim 1 where the second, deeper implant step ($E2 \cdot C2$) is performed before the first implant step ($E1 \cdot C1$), the method further including the step of annealing the substrate after the second implant step.

3. The method of claim 1 where the semiconductor substrate includes silicon and the insulation-forming particles are selected from the group consisting of oxygen and nitrogen.

4. The method of claim 3 further including the step of limiting the concentration of nitrogen to 2 or less atomic percent in the buried isolation region.

5. The method of claim 1 wherein the insulation-forming particles used in the second implanting step are essentially the same as the insulation-forming particles used in the first implanting step.

6. The method of claim 1 further comprising the steps of:

implanting a third concentration C3 of insulation-forming particles to a third depth Z3 of the substrate using third energy E3, said third implanting directly producing third defects in the crystalline structure of the substrate, the number or size of the third defects being a third function $f(C3 \cdot E3)$ of the product of the third concentration C3 and the third energy E3; and annealing the substrate between the second and third implant steps;

where $Z3 > Z2$, $E3 > E2$ and C3 is substantially less than C2 so that the number or size of said third defects produced in the substrate above first depth Z1 by the third implant step ($E3 \cdot C3$) is not substantially more than the number or size of said second defects produced by the second implant ($E2 \cdot C2$).

7. The method of claim 6 wherein the third implant step ($E3 \cdot C3$) is performed before the first and second implant steps ($E1 \cdot C1$ and $E2 \cdot C2$);

the method further including the step of annealing the substrate after the third implant step but before the first and second implant steps.

8. The method of claim 6 wherein the third concentration C3 of insulation-forming particles is 60 percent of the first concentration C1 or less.

9. The method of claim 8 wherein the second concentration C2 of insulation-forming particles is 80 percent of the first concentration C1 or less.

10. The method of claim 6 wherein the second depth Z2 is positioned substantially midway between the first depth Z1 and the second depth Z3.

11. The method of claim 6 wherein the insulation-forming particles used in the third implanting step are essentially the same as the insulation-forming particles used in the first and second implanting steps.

12. The method of claim 6 further comprising the step of:

gradually changing the constituency of the insulation-forming particles over the first through third implant steps to thereby define a gradually changing composition for the buried isolation region between the first and third depths, Z1 and Z3.

13. The method of claim 12 wherein the insulation-forming particles are selected to define the composition for the buried isolation region as having the general formulation: $Si_a O_b N_c$, wherein moving from a shallowest depth ZA of the buried isolation region to a deepest depth ZB of the buried isolation region, proportional parameter a increases gradually and monotonically, proportional parameter b decreases gradually and monotonically, and proportional parameter c generally remains below 2 atomic percent.

14. The method of claim 13 wherein between the shallowest depth ZA of the buried isolation region to the deepest depth ZB of the buried isolation region, proportional parameter a increases gradually and monotonically from approximately 34 atomic percent to 100 atomic percent, proportional parameter b decreases gradually and monotonically from approximately 66 atomic percent to 0 atomic percent, and proportional parameter c first increases gradually from 0 atomic percent toward 2 atomic percent and then decreases to 0 atomic percent.

15. A method for creating a buried isolation region in a crystalline semiconductor substrate, the method comprising the steps of:

implanting respective first through nth concentrations, C1 to Cn of insulation-forming particles at respective first through nth successive depths, Z1 to Zn of the substrate using respective first through nth energy levels, E1 to En;

wherein n is a number equal to 3 or more;

wherein each of the first through nth implants contributes a number of non-curable, significant defects to the crystal structure of the semiconductor substrate, said number being for each given implant, a function $f(C_i \cdot E_i)$ of the product of the concentration Ci and energy Ei used in the given implant, wherein for each energy level Ei in the series of energy levels, E2 to En, Ei is substantially greater than E(i-1);

wherein for each concentration Ci in the series of concentrations, C2 to Cn, ci is substantially less than C(i-1); and wherein respective concentration times energy products $C1 \cdot E1$ through $Cn \cdot En$ of the first through nth implants are selected so that the number of non-curable significant defects contributed by each ith implant do not substantially exceed the number of non-curable significant defects contributed by a next-lower, numbered (i-1)th implant.

16. The method of claim 15 wherein each said resultant significant defect has a minimum size of 0.1 $\mu m$.

17. The method of claim 15 further comprising the steps of:

setting the first concentration C1 sufficiently high to define a stoichiometric insulating composition at the corresponding first depth Z1; and setting one or more of the other concentrations, C2 to Cn, to less than the amount needed to define a stoichiometric insulating composition at the corresponding depth, Z2 to Zn.

18. The method of claim 17 further comprising the step of:

selecting the insulation-forming particles to define at the first depth Z1, a stoichiometric insulating composition selected from the group consisting of $SiO_2$ and $Si_3N_4$.

19. The method of claim 18 further comprising the step of:

selecting the insulation-forming particles to define at an ith depth Zi, below the first depth Z1, a non-stoichiometric insulating composition having the general formulation: $Si_a O_b N_c$, where proportional parameter a is greater than 33.3 atomic percent, proportional parameter b is less than 66.6 atomic percent, and proportional parameter c is less than 57 atomic percent.

20. The method of claim 15 further comprising the step of:
selecting the insulation-forming particles to define at an ith depth, Zi, a non-stoichiometric insulating composition having the general formulation: $Si_aO_bN_c$, where proportional parameter a is greater than 33.3 atomic percent, proportional parameter b is less than 66.6 atomic percent, and proportional parameter c is less than 57 atomic percent.

21. The method of claim 20 further comprising the step of:
selecting the insulation-forming particles to define at a jth depth, Zj, a stoichiometric insulating composition selected from the group consisting of $SiO_2$ and $Si_3N_4$.

22. A method for creating a buried isolation region in a crystalline semiconductor substrate, the method comprising the steps of:
implanting respective first through nth concentrations, C1 to Cn of insulation-forming particles at respective first through nth depths, Z1 to Zn of the substrate using respective first through nth energy levels, E1 to En;
wherein n is a number equal to 3 or more;
wherein for each energy level Ei in the series of energy levels, E2 to En, Ei is substantially greater than E(i-1);
wherein for each concentration Ci in the series of concentrations, C2 to Cn, Ci is substantially less than C(i-1); and
wherein at least an ith one of respective concentrations C1 to Cn is selected so as to form a non-stoichiometric insulating composition at the corresponding depth, Zi.

23. The method of claim 22 wherein respective concentrations C1 to Cn are selected so as to form a non-homogeneous collection of insulating compositions at corresponding depths, Z1 to Zn.

24. The method of claim 23 wherein respective energy levels, E1 to En are selected so as to form a continuous, but non-homogeneous collection of insulating compositions over the span of corresponding depths, Z1 to Zn.

25. The method of claim 22 wherein respective energy levels, E1 to En are selected so as to form a continuous collection of insulating compositions over the span of corresponding depths, Z1 to Zn, whereby the insulating composition at least the ith depth, Zi, is a non-stoichiometric insulating composition.

26. The method of claim 1 where the semiconductor substrate includes silicon and the insulation-forming particles essentially consist of oxygen.

27. The method of claim 1 where the semiconductor substrate includes silicon and the insulation-forming particles essentially consist of nitrogen.

28. The method of claim 1 further comprising the step of annealing the substrate after the second implant step and wherein the first and second depths, Z1 and Z2, are such that after said second anneal, the insulation-forming particles of the first and second implants are distributed in intermingled fashion within the substrate so as to define a relatively smooth continuum of insulative properties between the first and second depths, Z1 and Z2.

* * * * *